United States Patent
Akiyama et al.

(10) Patent No.: US 6,608,427 B2
(45) Date of Patent: Aug. 19, 2003

(54) HIGH-SENSITIVITY FLEXIBLE CERAMIC SENSOR

(75) Inventors: Morito Akiyama, Tosu (JP); Naohiro Ueno, Saga-ken (JP); Kiichi Ikeda, Oita (JP); Kazuhiro Nonaka, Tosu (JP); Hiroshi Tateyama, Tosu (JP)

(73) Assignee: Agency of Industrial Science and Technology, Tokyo-to (JP)

( * ) Notice: Subject to any disclaimer, the term of this patent is extended or adjusted under 35 U.S.C. 154(b) by 0 days.

(21) Appl. No.: 10/237,121

(22) Filed: Sep. 9, 2002

(65) Prior Publication Data

US 2003/0006678 A1 Jan. 9, 2003

Related U.S. Application Data

(63) Continuation of application No. 09/733,924, filed on Dec. 12, 2000, now abandoned.

(30) Foreign Application Priority Data

Aug. 10, 2000 (JP) .......................................... 2000-243053

(51) Int. Cl.[7] .......................... H01L 41/04; H01L 41/08; H01L 41/18; H02N 2/00

(52) U.S. Cl. ........................ 310/333; 310/321; 310/328; 310/324; 310/330

(58) Field of Search ............................... 310/321, 324, 310/330, 328, 333

(56) References Cited

U.S. PATENT DOCUMENTS

| | | | |
|---|---|---|---|
| 4,067,019 A | | 1/1978 | Fleischer et al. |
| 4,835,435 A | | 5/1989 | Yeung et al. |
| 5,185,589 A | | 2/1993 | Krishnaswamy et al. |
| 5,336,959 A | | 8/1994 | Park et al. |
| 5,424,716 A | | 6/1995 | Park |
| 5,446,332 A | | 8/1995 | Rapps et al. |
| 5,637,126 A | | 6/1997 | Ema et al. |
| 5,698,931 A | | 12/1997 | Shibata et al. |
| 5,789,845 A | | 8/1998 | Wadaka et al. |
| 5,825,119 A | | 10/1998 | Shibata et al. |
| 5,955,821 A | | 9/1999 | Yamamoto et al. |
| 5,955,824 A | * | 9/1999 | Saito et al. .................. 310/348 |
| 6,198,203 B1 | | 3/2001 | Hotomi |
| 6,246,155 B1 | * | 6/2001 | Nishihara et al. ........... 310/328 |
| 6,433,464 B2 | * | 8/2002 | Jones .......................... 310/328 |

* cited by examiner

*Primary Examiner*—Nestor Ramirez
*Assistant Examiner*—J. Aguirrechea
(74) *Attorney, Agent, or Firm*—Wenderoth, Lind & Ponack, L.L.P.

(57) ABSTRACT

Disclosed is a high-sensitivity flexible ceramic sensor for detecting mechanical shocks and vibrations, which comprises a metal foil of a specified thickness as a substrate, a single-crystalline thin film of a piezoelectric ceramic material such as aluminum nitride and zinc oxide having a specified thickness formed on the substrate, a metallic electrode formed on the thin ceramic film and an external circuit connecting the metal foil and the electrode with insertion of an electric meter for measuring the piezoelectric voltage changes induced in the ceramic thin film.

3 Claims, 2 Drawing Sheets

HIGH-SENSITIVITY FLEXIBLE CERAMIC SENSOR

This is a continuation of Ser. No. 09/733,924, filed Dec. 12, 2000, now abandoned.

BACKGROUND OF THE INVENTION

The present invention relates to a high-sensitivity flexible ceramic sensor having usefulness as an acceleration sensor for the air bag systems of automobiles and as a vibration sensor used for the measurement of high vibrational frequencies.

As is known, ceramic sensors are widely employed as an acceleration sensor for detecting the acceleration of an automobile caused by an accidental collision in order to bring the air bag system into operation or a vibration sensor for detecting abnormal vibrations of gas turbine blades and vibrations of high-speed vehicles due to troubles in the wheels and engines.

These ceramic sensors of which the sensing element is made from a ceramic material have a serious disadvantage in respect of mechanical strengths and heat shock resistance and are under a risk of destruction during use. As a means to alleviate this disadvantage, proposals are made to employ a sensing element made of a composite material consisting of a ceramic material and a plastic resin as a reinforcement of the ceramic material. This means, however, is necessarily accompanied by another problem due to a decrease in the sensitivity as a sensor.

SUMMARY OF THE INVENTION

The present invention has an object, in view of the above described problems in the prior art ceramic sensors, to provide a novel high-sensitivity ceramic sensor having high resistance against mechanical and thermal shocks to exhibit a high sensitivity with stability.

Thus, the high-sensitivity flexible ceramic sensor provided by the invention is an integral device which comprises:

a metal foil having flexibility;

a single-crystalline thin film of a piezoelectric ceramic material formed on one surface of the metal foil;

an electrode formed on the surface of the thin film of the piezoelectric ceramic material; and an external electric circuit connecting the metal foil and the electrode.

In particular, the metal foil and the thin film of the piezoelectric ceramic material each have a thickness in the range from 5 to 1000 $\mu$m and in the range from 0.2 to 10 $\mu$m, respectively, and the piezoelectric ceramic material is selected from the group consisting of aluminum nitride, zinc oxide and lithium niobate.

DETAILED DESCRIPTION OF THE PREFERRED EMBODIMENTS

In the following, the ceramic sensor of the present invention is described in more detail by making reference to the accompanying drawing.

Figure 1:
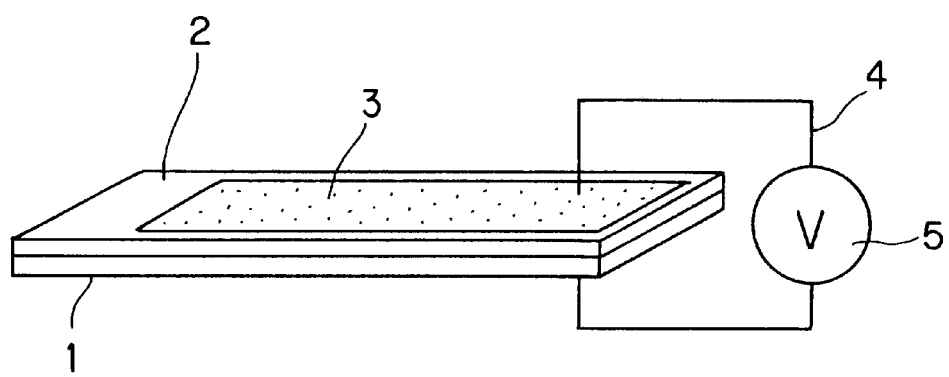
FIG. 1 is a perspective view of the inventive ceramic sensor.

FIG. 1 is a perspective view of an example of the inventive ceramic sensor which comprises a metal foil 1 and a thin film 2 of a single-crystalline piezoelectric ceramic material formed on the metal foil as the main part of the sensing element.

The metallic material forming the metal foil 1 can be selected from a variety of metals including aluminum, copper, stainless steels, nickel, titanium, zinc, tin, lead, tungsten and the like. Silicon, which is not a metal in a strict definition, can also be used if obtained in the form of a foil. The metal foil 1 has a thickness in the range from 5 to 1000 $\mu$m or, preferably, from 15 to 100 $\mu$m.

The metal foil 1 is provided on one surface with a thin film of a piezoelectric ceramic material in a single crystalline form. The piezoelectric ceramic material can be selected from the group consisting of aluminum nitride, zinc oxide, lithium niobate, silicon oxide, lithium tantalate, lead zirconate, lead titanate zirconate, lead titanate, barium titanate, lead niobate, strontium titanate and the like, of which aluminum nitride and zinc oxide are particularly preferable in respect of their relatively high mechanical strengths.

It is important in the present invention that the metallic material of the metal foil 1 is selected in consideration of the properties of the piezoelectric ceramic material or, in particular, the temperature of the film-forming process of the thin film of the ceramic material. When the piezoelectric ceramic material is aluminum nitride, of which the temperature of the film-forming process can be relatively low, for example, the metallic material can be aluminum or copper having a relatively low melting point. When the piezoelectric ceramic material is lithium niobate, of which the film-forming process is conducted at a high temperature, on the other hand, the metallic material of the metal foil 1 should preferably be a stainless steel or silicon having a high melting point.

The process of film formation of the piezoelectric ceramic material into the single-crystalline form is performed by a known method including physical film-forming methods such as the sputtering method, ion plating method, vacuum vapor deposition method, laser ablation method and the like and chemical film-forming methods such as the sol-gel method, MOCVD method and the like, of which the sputtering method is preferable because a single-crystalline thin film of the ceramic material can be formed at a relatively low temperature.

The single-crystalline thin film 2 of the piezoelectric ceramic material has a thickness in the range from 0.2 to 10 $\mu$m or, preferably, from 1 to 5 $\mu$m. When the thickness is too small, a sufficiently high sensitivity can hardly be obtained while, when too large, the ceramic film loses flexibility.

In the next place, an electrode 3 of a metallic material such as gold, silver, platinum, copper, aluminum and the like is formed on the single-crystalline thin film 2 of the piezoelectric ceramic material. The electrode 3 serves as a counter electrode to the metal foil 1.

Thus, the metal foil 1 and the electrode 3 are connected by an external electric circuit 4 including an electric metering instrument 5 such as an ammeter, voltmeter and the like to serve as a detector of the voltage changes induced between the metal foil 1 and the electrode 3 by the piezoelectric effect in the thin film 2 of the piezoelectric ceramic material.

In the following, the flexible ceramic sensor of the present invention is described in more detail by way of an Example.

EXAMPLE

A 15 mm by 30 mm wide aluminum foil of 15 $\mu$m thickness as a substrate was subjected to a sputtering treatment to form a single-crystalline thin film of aluminum nitride having a thickness of about 1 μm on one surface. The thus obtained composite sheet was subjected to the measurement of the mechanical properties to find that the bending strength was 1130 MPa at a strain of 0.36% while a polycrystalline sintered body of aluminum nitride had a bending strength of 392 MPa at a strain of 0.12%.

Figure 2:
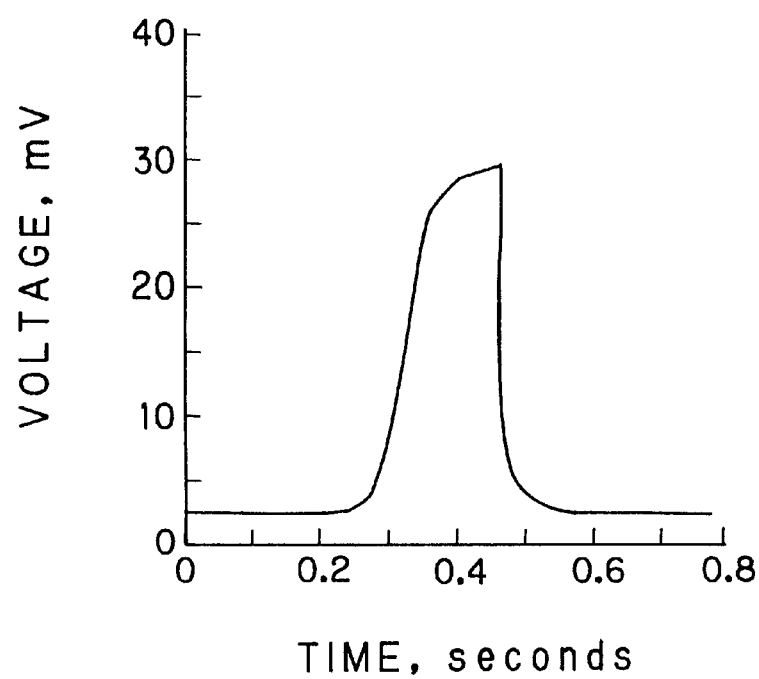
FIG. 2 is a graph showing a response curve of an acceleration sensor as an application of the inventive ceramic sensor prepared and tested in the Example.

In the next place, a 0.2 μm thick silver electrode of 20 mm length and 10 mm width was formed by plating on the thin aluminum nitride film. Further, lead wires of copper were bonded by soldering to the aluminum substrate and the silver electrode and connected to a voltmeter to form an external circuit of a completed ceramic sensor. A weight of 1 kg was mounted on the thus prepared ceramic sensor with intervention of a 20 mm by 20 mm wide insulating alumina plate of 1 mm thickness and the voltage change between the aluminum substrate and the silver electrode was measured. The result is shown in FIG. 2 as a function of the time elapsed from the moment when the weight was put on the silver electrode.

Figure 3:
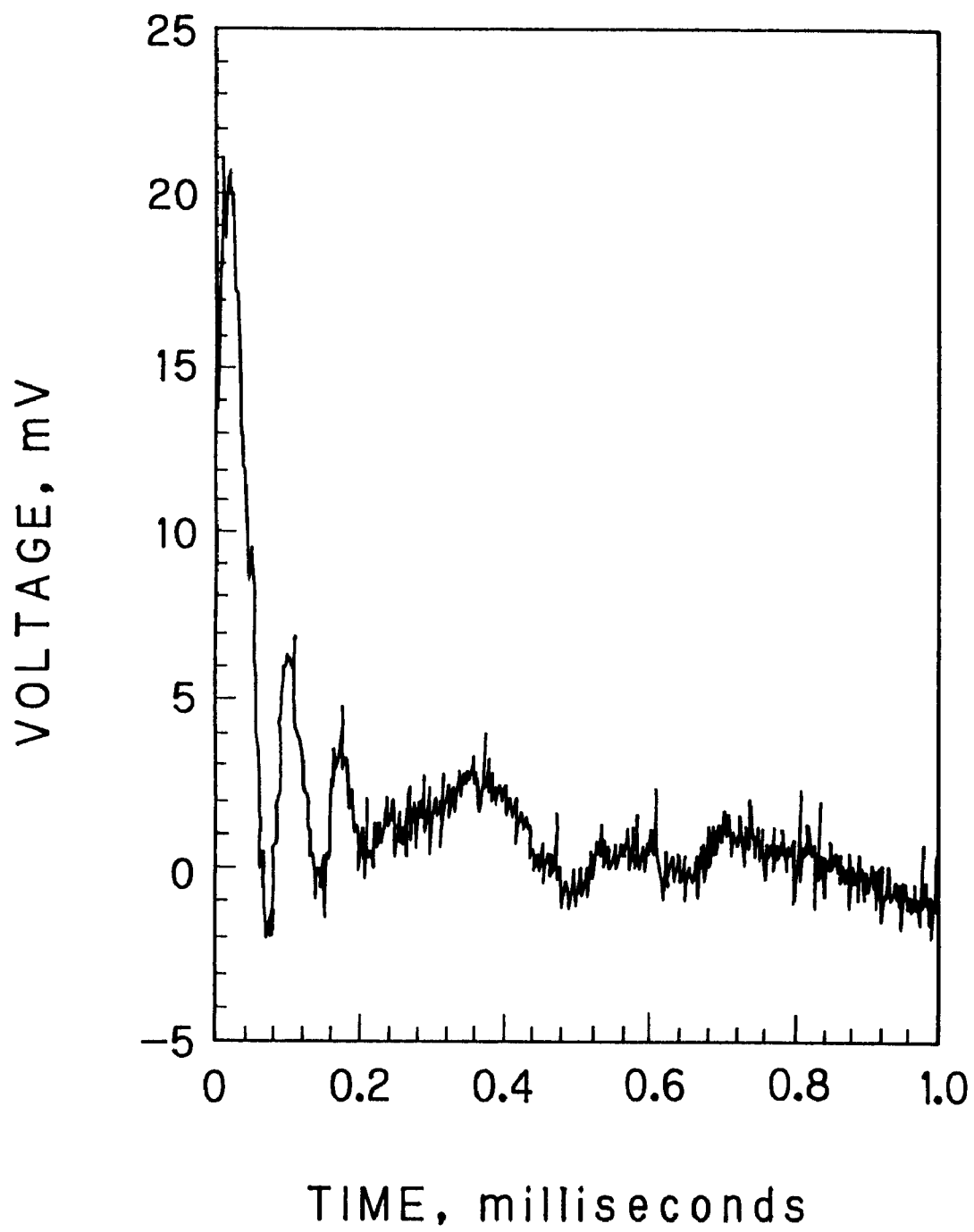
FIG. 3 is a graph showing oscillating voltage changes in the steel-ball dropping test.

Further, a steel-ball dropping test of the ceramic sensor as an acceleration sensor was undertaken. Thus, a steel ball of 14 g weight electrically connected to the silver electrode was dropped from a height of 4 cm onto the silver electrode and the response curve of the oscillating voltage changes was recorded as shown in FIG. 3. As is shown in this graph, the ceramic sensor exhibited excellent response characteristics with a response velocity of 0.05 millisecond.

What is claimed is:

1. A ceramic sensor as an integral device which comprises:

a metal foil as a substrate;

a single-crystalline thin film of a piezoelectric ceramic material formed on one surface of the metal foil wherein said single-crystalline thin film of a piezoelectric ceramic material has a thickness in the range from 0.2 to 10 μm and wherein the piezoelectric ceramic material is selected from the group consisting of aluminum nitride, zinc oxide nod lithium niobate;

an electrode formed on the surface of the thin film of the piezoelectric ceramic material, and an external electric circuit connecting the metal foil and the electrode.

2. The ceramic sensor as claimed in claim 1 in which the metal foil has a thickness in the range from 5 to 1000 μm.

3. The ceramic sensor as claimed in claim 1 wherein the single crystalline thin film of a piezoelectric material is formed by a sputtering method.

* * * * *